United States Patent [19]

Thornton

[11] 4,126,530
[45] Nov. 21, 1978

[54] METHOD AND APPARATUS FOR SPUTTER CLEANING AND BIAS SPUTTERING

[75] Inventor: John A. Thornton, Los Angeles, Calif.

[73] Assignee: Telic Corporation, Santa Monica, Calif.

[21] Appl. No.: 821,698

[22] Filed: Aug. 4, 1977

[51] Int. Cl.$^2$ .............................................. C23C 15/00
[52] U.S. Cl. .................... 204/192 EC; 204/192 E; 204/298
[58] Field of Search ............ 204/192 E, 192 EC, 298; 118/49.1, 49.5, 50.1

[56] References Cited

U.S. PATENT DOCUMENTS

| | | | |
|---|---|---|---|
| 3,341,442 | 9/1967 | Kay | 204/192 |
| 3,507,248 | 4/1970 | Seeley et al. | 118/48 |
| 3,661,747 | 5/1972 | Byrnes, Jr. et al. | 204/192 |
| 3,728,246 | 4/1973 | Barkhudarov et al. | 204/298 |
| 3,775,285 | 11/1973 | Lane | 204/298 |
| 3,884,793 | 5/1975 | Penfold et al. | 204/298 |
| 3,964,986 | 6/1976 | Mark | 204/192 |
| 3,998,718 | 12/1976 | Melliar-Smith | 204/298 |
| 4,041,353 | 8/1977 | Penfold et al. | 315/267 |

FOREIGN PATENT DOCUMENTS

| | | | |
|---|---|---|---|
| 4,419,684 | 8/1969 | Japan | 204/298 |
| 367,074 | 2/1932 | United Kingdom | 204/298 |
| 1,147,318 | 4/1969 | United Kingdom | 204/298 |

OTHER PUBLICATIONS

E. J. Brainard et al., "RF Sputter Etching & In-Situ Evaporation of Metals", *IBM Tech. Disc. Bull.*, vol. 19, pp. 2523-2524 (1976).

*Primary Examiner*—John H. Mack
*Assistant Examiner*—Aaron Weisstuch
*Attorney, Agent, or Firm*—Fulwider, Patton, Rieber, Lee & Utecht

[57] ABSTRACT

Cathode sputtering apparatus and a related method for its use in sputter cleaning and bias sputtering operations, in which work-pieces to be sputter-cleaned are secured to a cathode assembly in a configuration lending itself to the utilization of plasma traps which are highly conducive to efficient sputtering. Two basic embodiments are disclosed. In one embodiment, the cathode assembly takes the form of a hollow cylinder with inwardly projecting end flanges, the work-pieces being mounted with their surfaces to be cleaned facing inwardly, and in the other embodiment it takes the form of a cylindrical post with outwardly projecting end flanges, with the surfaces to be cleaned facing outwardly. Also disclosed are related techniques for sputter coating work-pieces immediately following a sputter cleaning step.

27 Claims, 18 Drawing Figures

METHOD AND APPARATUS FOR SPUTTER CLEANING AND BIAS SPUTTERING

BACKGROUND OF THE INVENTION

This invention relates generally to electrode-type glow discharge devices which can be used for sputter cleaning and bias sputtering. More particularly, the invention relates to such devices of a type utilizing a magnetic plasma trap for more efficient sputtering.

The process of cathode sputtering is well known, and has been described in many publications and patents, some of which are listed in U.S. Pat. No. 3,884,793, entitled "Electrode Type Glow Discharge Apparatus" and issued in the names of Alan S. Penfold and John A. Thornton. In essence, the cathode sputtering process operates to remove atoms from a target electrode with sufficient energy that they can interact with the atomic structure of a work surface, usually referred to as a substrate, and form thereon a permanent coating of the material removed from the target electrode. In a diode sputtering apparatus, the target electrode is connected as a cathode, and is placed in a discharge chamber to provide a low pressure gaseous environment which becomes ionized in the vicinity of the target cathode. Ionized atoms of the gas bombard the target cathode and drive off, that is sputter, atoms of the target material. The substrate to be coated with the target material is positioned in the path of the sputtered atoms, which then recombine on the substrate surface to form a coating having generally the same chemical composition as the target material, although not necessarily the same physical properties.

In sputter cleaning, the substrate itself is connected as a cathode, and becomes the target for bombardment by ions of the gas. The sputtered atoms of substrate material, and of any surface contaminants, may be collected on an appropriately located shield. After the substrate has been cleaned by this process of atomic removal, a target cathode may be activated, so that the target material is then coated onto the sputter cleaned substrate surface.

In bias sputtering, there are two target cathodes, one being of the material to be applied as a coating, and the other being the substrate itself, which is usually biased to a negative potential of lesser magnitude than that of the target cathode of coating material. While atoms are being removed from the substrate by sputtering, target material atoms are simultaneously applied as a coating to the substrate, at a greater rate than the rate of substrate atom removal. The transition from sputter cleaning to bias sputtering, or from sputter cleaning to sputter coating, may be made in such a way that, during the transition, sputtered material is passed back and forth between the target and substrate cathodes. Accordingly, an interface of graded composition can be formed between the substrate and the resultant coating. Bias sputtering is utilized in some instances to modify the metallurgical structure of the substrate coating and, in some instances, to remove impurity atoms which become weakly bonded to the surface of the growing coating during deposition, and which might otherwise become incorporated into the coating.

It is highly desirable in cathode sputtering processes for the ionized gas, i.e. the gas plasma, to be confined to a region close to the cathode. The ions produced in the plasma will then most likely be drawn to the cathode, and not lost to the walls of the surrounding discharge chamber. The aforementioned patent is directed to apparatus for maintaining one or more plasma traps in the vicinity of a cathode. The plasma is trapped by an appropriately shaped magnetic field which also has the effect of inducing electrons in the plasma to follow a spiral path, thereby encouraging a relatively large number of collisions with neutral gas atoms, and producing ions at a desirable high rate.

In accordance with the teachings of the aforementioned patent, the cathode takes the form either of a cylinder or post with outwardly projecting end flanges, wherein the plasma is confined to a cylindrical sheet around the exterior of the cathode, or of a hollow cylinder having inwardly projecting end flanges, wherein the plasma is confined to an internal cylindrical sheet. In either case, the substrate to be coated is normally positioned outside of the plasma region. Consequently, sputter cleaning and bias sputtering cannot be conveniently effected since there is little plasma in the vicinity of the substrates. In cathode sputtering devices in which no attempt is made to confine the plasma close to the cathode, i.e., in which there are no plasma traps, sputter cleaning or bias sputtering can be accomplished merely by applying the appropriate negative potential to the substrates, which would then become targets for ions in the unconfined plasma cloud. These devices, however, suffer from the disadvantages pertaining to sputtering devices which have no plasma traps to increase sputtering efficiency.

Accordingly, one result of the substantial improvements in cathode sputtering processes taught in the aforementioned patent is that there is now a clear need to provide a technique for sputter cleaning and bias sputtering in devices which utilize plasma traps to confine the ionized gas in proximity to the cathode. In general, substrates are not cylindrical in shape, and do not therefore lend themselves to sputter cleaning by techniques which utilize plasma trap configurations. Furthermore, when attempting to perform bias sputtering for purposes of modifying the metallurgical structure it is necessary that the ion current to the substrate be sufficient to re-sputter a significant fraction of the coating flux. Very high coating fluxes are possible with the teachings of the aforementioned patent. Thus, high bias sputtering rates are required to affect the metallurgical structure. Such bias sputtering rates cannot conveniently be achieved with most substrate shapes because of their low sputtering efficiency. The present invention is directed to a solution to these problems.

SUMMARY OF THE INVENTION

The present invention resides in apparatus, and a related method, for sputtering material from work-pieces in a gaseous environment. Basically, and in general terms, the apparatus of the invention includes a housing to contain the gaseous environment, an approximately cylindrical cathode assembly, including means for supporting work-pieces therein, anode means, and magnetic field means. The cathode assembly is adapted to be coupled to a power supply, and includes portions which define a trap region for high and low energy electrons in proximity to the work-pieces when supported in the cathode assembly. The trap region includes a cathode sheath, and substantially all of the high-energy electrons are generated on the surface of the work-pieces and of the cathode assembly by secondary emission. The anode means is also adapted to be coupled to a power supply, and is located outside the trap region of the cathode assembly. The magnetic field means generates a magnetic field having magnetic flux lines in close proximity to, and substantially parallel with, the surfaces of the work-pieces, and the trap region is defined by the magnetic field and by surfaces of the cathode assembly and the work-pieces at substantially cathode potential.

More specifically, the cathode assembly and the means for supporting the work-pieces therein are constructed in such manner that the work-pieces are supported with their surfaces to be cleaned in a configuration which lends itself to the formation of a trap region conducive to efficient sputtering. Two basic embodiments of the invention apparatus are contemplated. In one, the cathode assembly includes a hollow cylinder with inwardly directed end flanges, and the work-pieces are supported with their surfaces to be cleaned on the inside of the cylinder. In the other basic embodiment, the cathode assembly includes a cylinder or post with outwardly directed end flanges, and the work-pieces are supported with their surfaces to be cleaned on the outside of the cylinder. As used herein, the term "cylinder" is intended to include an approximation of a true cylindrical form, such as may be provided by a plurality of flat surfaces.

In terms of a novel method, the invention includes the steps of supporting at least one work-piece in a cathode assembly having an approximately cylindrical shape conducive to the formation of a plasma trap region adjacent to surfaces of the work-pieces, applying a negative voltage to the cathode assembly, with respect to an anode, generating a magnetic field having flux lines closely adjacent and parallel to the surfaces of the work-pieces to be treated, thereby creating the plasma trap region adjacent the work-pieces, and sputtering material from the work-piece surfaces.

The method may also include collecting the material sputtered from the work-pieces on a shield, and subsequently removing the shield, removing the voltage previously applied to the cathode assembly, and applying a negative voltage to a separate target cathode made of material to be coated on to the work-pieces, whereby a sputter cleaning step can be followed by a sputter coating step.

It will be apparent that the present invention provides a hitherto unavailable technique for sputter cleaning and bias sputtering work-pieces while still taking advantage of highly efficient cathode configurations which utilize plasma trap principles. Other aspects and advantages of the present invention will become apparent from the following more detailed description, taken in conjunction with the accompanying drawings.

DESCRIPTION OF THE PREFERRED EMBODIMENTS

As shown in the drawings by way of example, the present invention is principally concerned with apparatus, and a related method, for sputtering material from work-pieces or substrates in either a sputter cleaning or a bias sputtering operation. As briefly explained above, the cathode sputtering process is one in which ionized gas atoms are electrically accelerated toward a cathode surface to drive off or sputter atoms of the cathode material. In the sputter coating process, a substrate is positioned in the path of the sputtered atoms and is thereby coated with the cathode material. In sputter cleaning, the substrate itself is connected as a cathode, and its surface material is sputtered off in the cleaning operation. In bias sputtering, both the substrate and a separate cathode are connected as cathodes, and material is simultaneously sputtered from and coated onto the substrate surface.

For most efficient sputtering, the ionized gas should ideally be confined to a trap region very close to the cathode, and various cathode geometries have been proposed to achieve this effect, principally in connection with sputter coating operations. However, removal of surface material from substrates by sputter cleaning has not been conveniently possible using these cathode geometries.

In accordance with the present invention, substrates are supported in a generally cylindrical cathode assembly, the shape of which lends itself to the formation of a plasma trap region conducive to efficient sputtering. As will be explained in more detail, the cathode assembly of the present invention takes the form of a cylinder, or an approximation of a cylinder, having either inwardly directed end flanges or outwardly directed end flanges. In either case, substrates of various shapes and sizes may be supported in the cathode assembly, and a magnetic field is generated, with magnetic flux lines parallel to the surfaces of the substrates. The plasma trap region is bounded by the surfaces of the substrates and of the cathode assembly, and by the magnetic flux lines close to the substrate surfaces. The aforedescribed sputter cleaning apparatus may be conveniently combined with sputter coating apparatus, so that the substrates can be immediately subjected to a coating operation after cleaning.

Figures 1, 2, 3, 4, 5, 6:
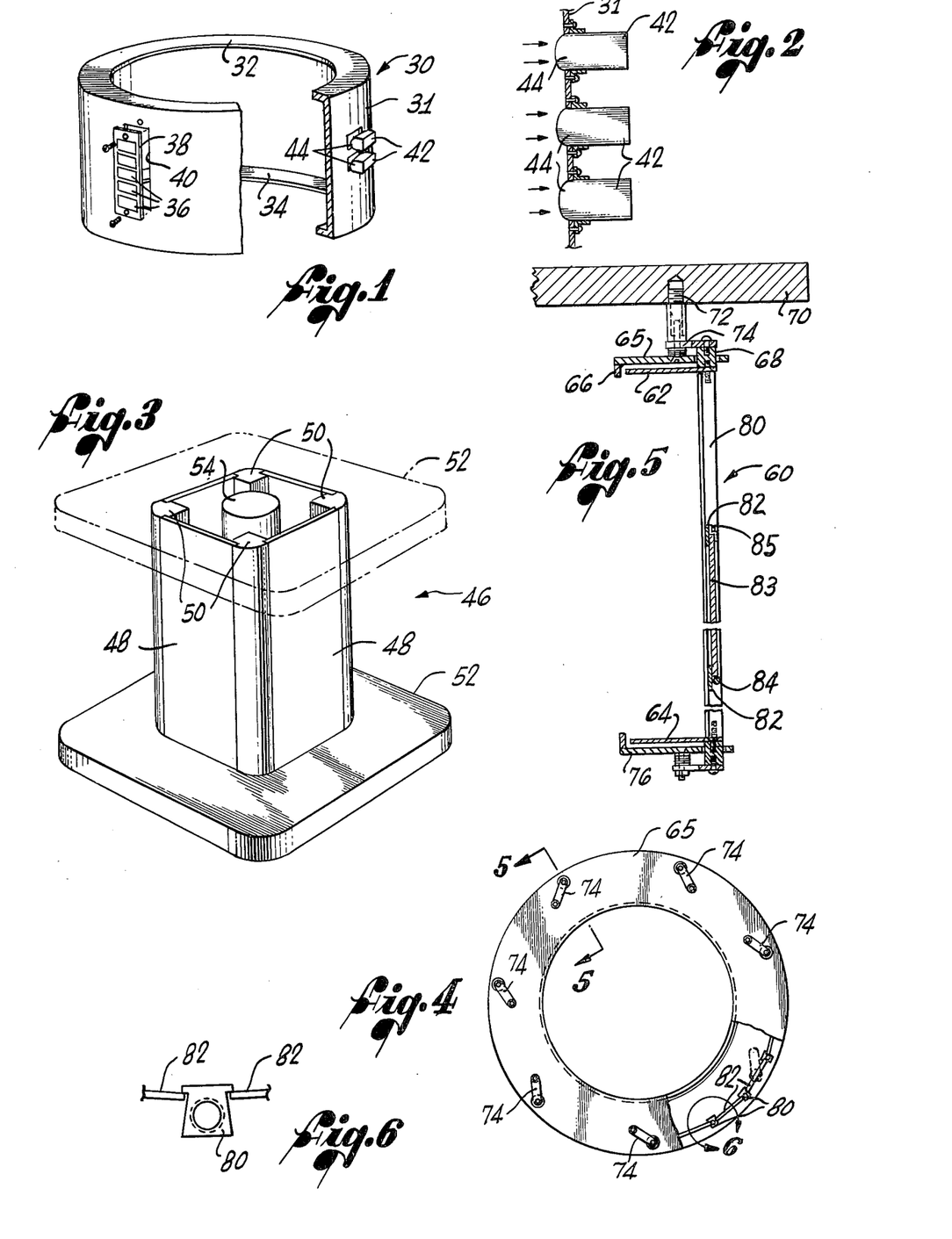
FIG. 1 is a simplified perspective view of an internally flanged cylindrical cathode assembly for supporting work-pieces in accordance with the present invention.
FIG. 2 is a sectional view through the cylindrical wall of the cathode assembly of FIG. 1, showing how work-pieces of one particular configuration are supported in the assembly.
FIG. 3 is a simplified perspective view of an externally flanged cylindrical cathode assembly having four flat faces.
FIG. 4 is a plan view of portions of sputter cleaning apparatus having an anode and a cathode assembly of the same type as that shown in FIG. 1.
FIG. 5 is a sectional view taken substantially along the line 5—5 in FIG. 4, and also showing a portion of a vacuum chamber.
FIG. 6 is a fragmentary enlarged view of that portion of FIG. 4 indicated by the circle 6, and particularly illustrating a means for supporting work-pieces in the apparatus.

FIGS. 1 and 3 show the two basic embodiments of the invention apparatus. FIG. 1 shows a cylindrical cathode assembly, indicated by reference numeral 30, having a cylindrical wall 31, and integral, inwardly projecting end flanges 32 and 34. Work-pieces, which may take the form of flat substrates 36, are supported in appropriate openings in the wall 31, with the substrate surfaces to be cleaned facing inwardly. The substrates 36 may, for example, be secured in a frame 38 which is removably attached to a corresponding rectanglar opening 40 in the cylindrical wall 31. Alternatively, the work-pieces may take the form of solid blocks 42 having convex faces 44 to be coated, and these may be secured in the wall 31, as shown in greater detail in FIG. 2.

As discussed in detail in the aforementioned U.S. Pat. No. 3,884,793, a highly efficient sputtering process can be maintained in a cathode assembly 30 of this type if the ionized gas in which the cathode assembly is located is confined to a trap region in close proximity to the interior cylindrical surface of the assembly. This is accomplished by exposing the cathode assembly 30 to a magnetic field parallel to the principal axis of the cylinder forming the assembly. It will be appreciated that an anode and power supply are also required, but these have been omitted from FIG. 1 for clarity.

FIG. 3 shows a different form of cathode assembly 46, in which work-pieces are mounted on four flat plates 48 disposed about a central axis in an approximation of a cylinder. Although only four such plates 48 are illustrated, it will be appreciated that a larger number could be utilized, and that such an arrangement would more closely approximate a cylindrical surface. The plates 48 are secured to a like number of mounting posts 50 disposed between adjacent plates, and there are two outwardly projecting end flanges 52. The end flanges 52 in FIG. 3 are approximately square in shape, with rounded corners. Of course, as the number of plates 48 is increased, the flanges 52 would become more nearly circular in shape. As in the hollow cathode assembly 30 illustrated in FIG. 1, the FIG. 3 cathode assembly 46 is subjected to a magnetic field parallel to its principal axis, and the plasma is thereby contained in a plasma trap region close to the surface of the work-pieces secured to the plates 48. Again, a highly efficient sputter cleaning process results. If required, a centrally disposed heater 54 may be included, to maintain the substrates at an appropriate substrate temperature during the sputtering operation. In sputtering processes, temperature is usually a critical parameter affecting the properties of the coatings, and may need to be controlled in this manner.

FIGS. 4-6 illustrate a presently preferred form of the invention apparatus with a cathode assembly of the type shown in FIG. 1, i.e., including a hollow cylindrical cathode. As best shown in FIG. 5, this apparatus has a cathode assembly 60 with inwardly projecting end flanges 62 and 64, and an anode ring 75 overlying the upper flange 62, and slightly axially spaced therefrom. The anode ring 65 includes an outer cylindrical rim 66 which extends around the edge of the upper flange 62 to provide an electrode surface for electrons leaving the plasma region. The anode ring 65 is, of course, electrically insulated from the cathode assembly 60, by means of an insulated bushing 68 which is also used to mechanically support the cathode assembly. The anode ring 65 and cathode assembly 60 are secured to the upper wall of a vacuum chamber, indicated at 70, by any convenient means, such as the bolts 72 and lugs 74. At the lower end of the cathode assembly 60 is an annular shield 76 having substantially the same shape as the anode ring 65, but which is not connected to the electrical supply. As best shown in FIGS. 4 and 6, the cathode assembly 60 includes a plurality of axially extending mounting posts 80, between which elongated mounting frames 82 are secured. The mounting frames 82 form openings for the installation of substrates. As shown in FIG. 5, a substrate, indicated at 83, can be secured to one of the mounting frames 82 by means of a retaining pin 84, which both retains and supports the substrate at its bottom edge, and a clamp 85 installed at the upper edge of the substrate.

Figure 7:
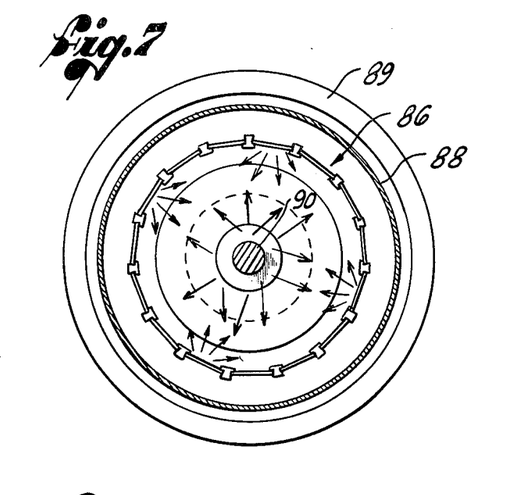
FIG. 7 is a simplified plan view of sputtering apparatus including a cathode assembly of the same type as that shown in FIG. 1, and further including a central post cathode to be used for sputter coating of the work-pieces.

FIG. 7 shows in simplified form how the embodiment of the apparatus shown in FIGS. 4-6 can be used in a cleaning and coating operational sequence. The apparatus shown in FIG. 7 includes a cathode assembly 86, of the hollow cylindrical type shown in FIG. 1, located inside a discharge chamber 88 which is, in turn, surrounded by a cylindrical magnetic field coil 89. Also included is a cylindrical post cathode 90, centrally located within the cathode assembly 86. Thus, the apparatus can be used for sputter cleaning of substrates supported on the cathode assembly 86, as described in relation to FIGS. 4-6, and subsequently used for sputter coating when the post cathode 90 is connected as a cathode and the cathode assembly 86 is disconnected. It will also be appreciated that the apparatus can be utilized for bias sputtering if the post cathode 90 and the cathode assembly 86 are both connected as cathodes.

Figure 8:
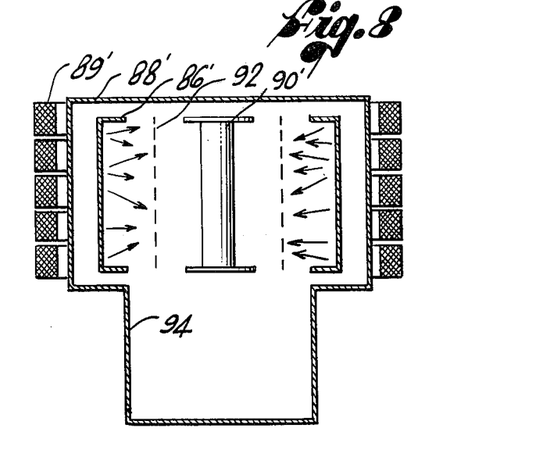
FIG. 8 is a simplified sectional view of sputter cleaning and coating apparatus of the type shown in FIG. 7, and including a sputtering shield which is used to collect the material sputtered from the cathode assembly and work-pieces.
Figure 9:
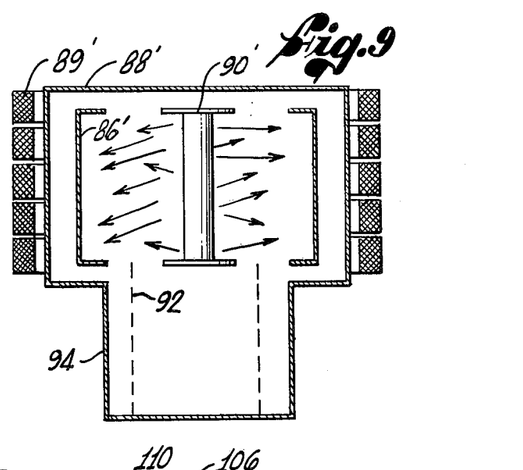
FIG. 9 is a view similar to FIG. 8, but with the sputtering shield lowered for a sputter coating operation.

FIGS. 8 and 9 show in simplified form an arrangement similar to that of FIG. 7, including a cathode assembly 86', a discharge chamber 88', a magnetic field winding 89' and a post cathode 90', and also including a cylindrical shield 92 which may be positioned, as shown in FIG. 8, between the cathode assembly and the post cathode. Additionally, the discharge chamber 88' includes a depending well-like portion 94 into which the shield 92 may be lowered, as indicated in FIG. 9. In the sputter cleaning process, material is sputtered from substrates secured to the cathode assembly 86', and is collected on the shield 92, as shown in FIG. 8. Then the shield 92 may be lowered, and the apparatus used for sputter coating, as shown in FIG. 9.

Figure 10:
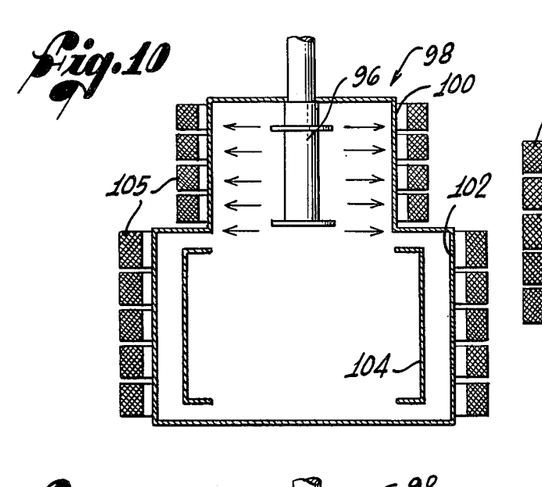
FIG. 10 is a simplified sectional view of another form of sputter cleaning and coating apparatus, having a cathode assembly similar to that shown in FIG. 3.
Figures 11, 12:
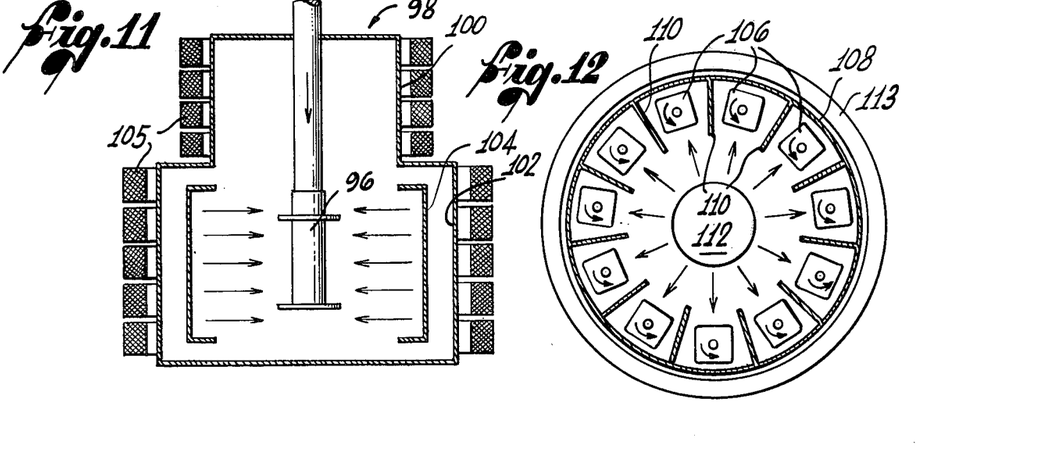
FIG. 11 is a view similar to FIG. 10 but showing the cathode assembly lowered for a sputter coating operation.
FIG. 12 is a simplified plan view of sputter cleaning and coating apparatus having a plurality of cathode assemblies of the same type as that shown in FIG. 3, and having a central post cathode for sputter coating purposes.

FIGS. 10 and 11 show an analogous arrangement in which a cathode assembly 96 takes the form of a cylindrical post structure of the same type as that illustrated in FIG. 3. The cathode assembly 96 is positioned in a surrounding discharge chamber 98 having two sections: an upper sputter cleaning section 100 which acts as a shield to collect materials sputtered from the substrates secured to the cathode assembly 96, and a lower sputter coating section 102, which surrounds a hollow cylindrical cathode 104 of the material used to coat the substrates. During sputter cleaning, the cathode assembly 96 is positioned in the upper section 100, as shown in FIG. 10, and during the sputter coating operation it is lowered to the lower section 102, as shown in FIG. 11. Two magnetic field windings 105 surround the upper and lower sections 100 and 102, and provide the required magnetic fields for the sputter cleaning and coating operations.

FIG. 12 shows another variation of the basic post cathode form similar to that shown in FIG. 3. However, a plurality of such cathode assemblies 106 are included, and these are spaced uniformly about the inner periphery of a cylindrical discharge chamber 108. Sputtering shields 110 are radially disposed in the chamber 108 between adjacent cathode assemblies 106. During the cleaning operation, the plurality of cathode assemblies 106 functions in much same manner as the single unit shown in FIG. 3, and the contamination sputtered from the surface of substrates mounted in the assemblies is collected on the shields 110. Also included is a central post cathode 112 which is used for sputter coating operations on the substrates, and a magnetic field winding 113 surrounding the chamber 108. The cathode assemblies 106 may be rotated to provide more uniform exposure to a coating flux from the central cathode 112.

Figures 13, 15, 17:
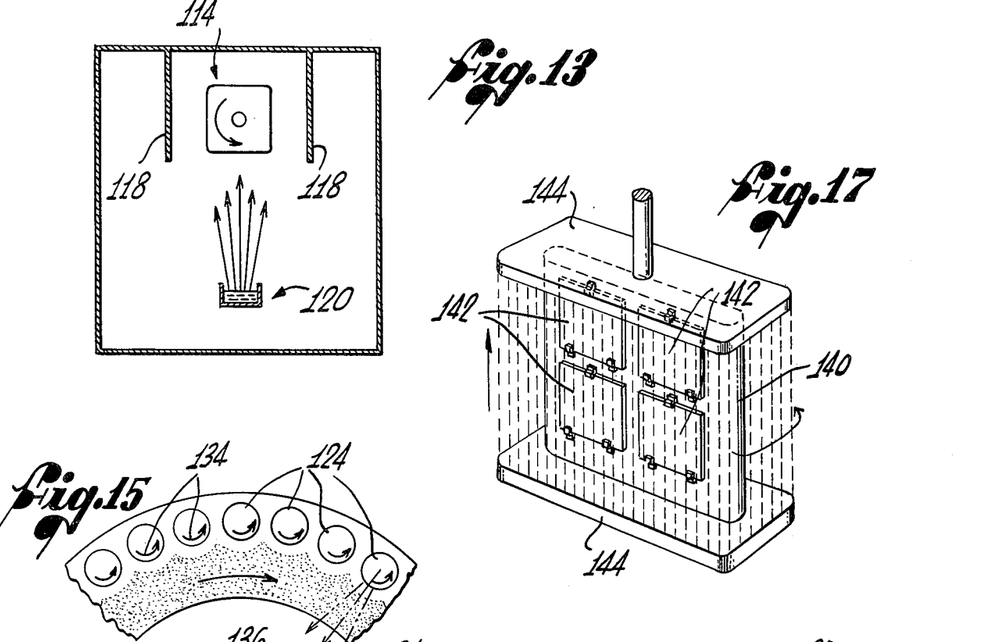
FIG. 13 is a simplified sectional view of sputter cleaning apparatus utilizing a cathode assembly similar to that shown in FIG. 3, but including provision for a non-sputtering coating process.
FIG. 15 is an enlarged fragmentary plan view of a peripheral portion of the apparatus shown in FIG. 14.
FIG. 17 is a modified form of a cathode assembly of the type shown in FIG. 3, wherein the cathode has a generally cylindrical shape with only two faces.

A similar arrangement is illustrated in FIG. 13, wherein a single cathode assembly 114, of the basic type shown in FIG. 3, is positioned in a discharge chamber 116, and appropriate shields 118 are disposed on each side of the assembly. Inside the chamber 116 is an evaporation source 120 which may be used to apply a coating to work-pieces mounted on the cathode assembly 114. Again, the assembly 114 may be rotated for a more uniform coating flux. As illustrated in FIG. 13, the present invention has application in those areas in which non-sputtering coating processes are used, but in which it may be desired to sputter clean the work-pieces before exposure to the coating process.

Figures 14, 16, 18:
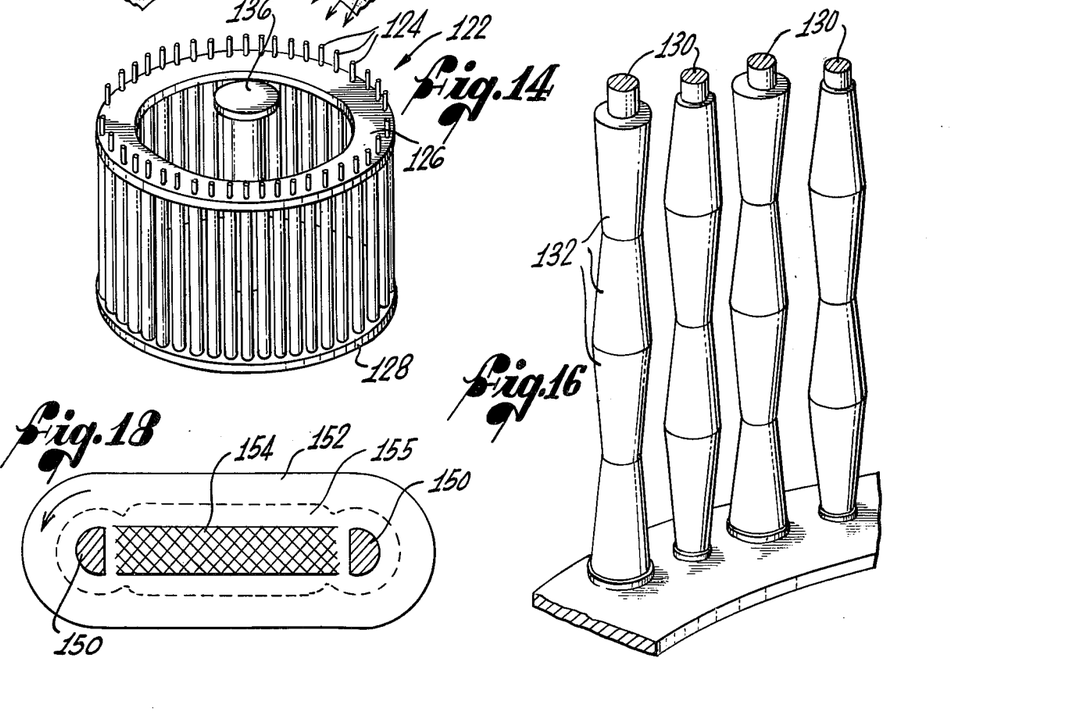
FIG. 14 is a simplified perspective view of sputter cleaning and coating apparatus having a relatively large plurality of cathode assemblies of the same type as that shown in FIG. 3, and including a central post cathode for sputter coating purposes.
FIG. 16 is a further enlarged, fragmentary perspective view of four cathode assemblies of the type used in the apparatus of FIGS. 14 and 15.
FIG. 18 is a simplified plan view, shown partly in section, of a cathode assembly of the same type as that shown in FIG. 17.

FIGS. 14-16 show yet another variation of the basic embodiment of the cathode assembly shown in FIGS. 3 and 12. In this version, there is a cathode assembly 122 which takes the hollow cylindrical cathode form of FIG. 1, but which includes a relatively large plurality of cylindrical cathode assembly elements 124 disposed around the outer periphery of the assembly 122. More specifically, the assembly 122 comprises a pair of annular flanges 126 and 128 adapted to receive elongated rods 130 (FIG. 16) on which work-pieces 132 may be threaded. The work-pieces are basically cylindrical or conical in shape and have a central bore through which the rods 130 may be fitted. As in the form disclosed in FIG. 12, the rods 130, including the work-pieces 132, may be rotated, as shown by the arrows 134 in FIG. 15, to provide more uniform coverage during a coating operation. A central post cathode 136 is utilized for the coating operation, in a similar manner to that described in relation to FIG. 12. Magnetic field coils have been omitted for clarity in FIGS. 13-18, but are, of course, required.

FIG. 17 is a variation of the FIG. 3 embodiment, the number of surfaces forming the "cylinder" having been reduced to two. Basically, the FIG. 17 apparatus includes a flat central plate 140 of moderate thickness, on which work-pieces 142 are clamped, and a pair of substantially rectangular end flanges 144. Essentially, this version is a "two-sided cylinder", and functions in the same manner as was described in relation to the cylindrical form of FIG. 3.

FIG. 18 shows a related form of the assembly shown in FIG. 17. This cathode assembly comprises two parallel posts 150 of substantially simicircular cross section and two end flanges 152. The work-piece is a honeycomb structure 154 which is positioned between the posts 150 in such a manner as to form a post cathode similar to the one shown in FIG. 17. The posts 150 could be circular in cross section, or any other desired shape, but the semicircular cross section illustrated preserves the continuity of the external contours of the cathode assembly and the plasma sheath 155 that surrounds it.

It will be appreciated that the various embodiments of the invention can also be utilized in bias sputtering operations. For example, in the apparatus shown in FIG. 9, the cathode assembly 86' and the post cathode 90' can be simultaneously energized to provide a bi-directional flux of material, from substrates secured to the cathode assembly and from the post cathode of coating material. The voltages applied to the cathode assembly 86' and the post cathode 90' can be adjusted to provide a net flux of coating material onto the substrates, and to form a resultant coating of the desired metallurgical structure and properties.

To avoid any contamination of the substrates during a transition from sputter cleaning to bias sputtering, or from sputter cleaning to sputter coating, the voltages on the cathode assembly 86' and post cathode 90' can be controlled to provide a transition period during which an interface layer of graded substrate and coating material is deposited on the substrates, prior to the deposition of a pure coating or a bias-sputtered coating of the desired characteristics. More specifically, the post cathode 90' is energized after a sputter cleaning phase; then the voltage on the cathode assembly 86' is gradually reduced toward zero until the desired bias-sputtering or sputter-coating mode of operation is attained.

It will be appreciated from the foregoing description that the present invention represents a significant advance in the field of cathode sputtering processes as applied to sputter cleaning and bias sputtering. In particular, the invention provides a novel technique for applying plasma trap principles to the sputter cleaning and bias sputtering processes. The apparatus of the invention includes cathode assemblies in which work-pieces or substrates can be supported in plasma trap configurations which are conducive to highly efficient sputtering processes. It will also be appreciated that, although specific embodiments of the invention have been described in detail herein for purposes of illustration, various modifications may be made without departing from the spirit and scope of the invention. Accordingly, the invention is not to be limited except as by the appended claims.

I claim:

1. Apparatus for sputtering material from surfaces of work-pieces in a gaseous environment, said apparatus comprising:
   a housing for the gaseous environment;
   a generally cylindrical cathode assembly, including means for supporting a plurality of work-pieces thereon such that the surfaces of the work-pieces when mounted on said cathode assembly, present sputtering surfaces which form discontinuities in and departures from a perfectly cylindrical cathode surface, said cathode assembly being coupled to a power supply and including portions which define a trap region for electrons in proximity to the work-pieces when supported in said cathode assembly, and said trap region forming a generally cylindrical sheath around said cathode assembly and the work-pieces, to promote ionization in the trap region and to improve the efficiency of the sputtering process;
   anode means coupled to a power supply and located outside said trap region; and
   magnetic field means for generating a magnetic field with flux lines in close proximity to and substantially parallel with the surfaces of the work-pieces, whereby said trap region is formed by said magnetic field and by surfaces at cathode potential, and whereby material can be efficiently sputtered from the work-pieces.

2. Apparatus as set forth in claim 1, wherein:
   said cathode assembly includes a hollow cylinder and a pair of inwardly projecting end flanges;
   said means for supporting the work-pieces includes means for mounting them on said hollow cylinder with the surfaces from which material is to be sputtered facing inward; and
   said magnetic field means produces flux lines substantially parallel with the interior surface of said cylinder.

3. Apparatus as set forth in claim 1, wherein:
   said cathode assembly includes a cylindrical post and a pair of outwardly projecting end flanges;
   said means for supporting the work-pieces includes a plurality of flat supporting frames arranged about said post and forming a portion thereof; and
   said magnetic field means produces flux lines substantially parallel with the exterior surfaces of said post and the work-pieces supported thereon.

4. Apparatus for sputtering material from surfaces of work-pieces in a gaseous environment, said apparatus comprising:
   a housing for the gaseous environment;
   a cathode assembly having
      a generally cylindrical body made up of a plurality of flat mounting plates,
      means for supporting work-pieces on said mounting plates, the surfaces from which material is to be sputtered facing outwardly and forming discontinuities in and departures from a perfectly cylindrical cathode surface, and
      a pair of outwardly projecting end flanges affixed to said cylindrical body;
   anode means biased positively with respect to said cathode assembly; and
   magnetic field means for generating flux lines in close proximity to and substantially parallel with the surfaces of the work-pieces, said flux lines and the surfaces of said cathode assembly and work-pieces together defining a cylindrical plasma trap region which encourages efficient sputtering from the work-pieces.

5. Apparatus as set forth in claim 4, wherein
   said housing includes a sputter cleaning portion and a sputter coating portion; and
   said apparatus further includes hollow target cathode means, and means for moving said cathode assembly between a first position in which said cathode assembly is in said sputter cleaning portion of said housing, and a second position, in which said cathode assembly is in said sputter coating portion of said housing and is surrounded by said hollow target cathode means.

6. Apparatus as set forth in claim 4, and further including:
   a plurality of said cathode assemblies, spaced apart in an approximately cylindrical array; and
   a plurality of collecting shields disposed between said cathode assemblies to collect contaminants sputtered from the work-pieces.

7. Apparatus as set forth in claim 6, and further including means for rotating each of said cathode assemblies about its longitudinal cylindrical axis.

8. Apparatus as set forth in claim 7, and further including a central post cathode to be used as a target cathode to sputter coat or bias sputter coat the work-pieces, whereby rotation of said cathode assemblies results in a more uniform coating on the work-pieces.

9. Apparatus as set forth in claim 4, wherein:
   said flat plates of said cathode assembly are two in number, and are joined by rounded portions at their adjoining edges.

10. Apparatus as set forth in claim 9, wherein:
   said flat plates are formed in part by surfaces of the work-pieces; and
   said rounded portions are essentially semi-circular in cross section.

11. Apparatus as set forth in claim 4, and further including:
   sputter shield means partly surrounding said cathode assembly to collect the material sputtered therefrom;
   means for rotating said cathode assembly; and
   a coating material source located within said housing, to be used in coating the work-pieces after sputter cleaning.

12. Apparatus as set forth in claim 4, and further including work-piece heating means located interiorly with respect to said flat plates.

13. Apparatus for sputtering material from work-pieces in a gaseous environment, said apparatus comprising:
   a housing for the gaseous environment;
   a cathode assembly having
      a pair of annular end plates each of which has a plurality of holes therethrough, and
      a plurality of mounting rods engaged in corresponding pairs of said holes in said end plates to form a cage-like structure, said rods being also engageable through work-pieces of a generally cylindrical or conical shape;
   means for rotating said rods and the work-pieces mounted thereon;
   anode means biased positively with respect to said cathode assembly; and magnetic field means for generating flux lines in close proximity to and substantially parallel with the work-pieces, whereby a plasma trap region is created between said end plates and extending inwardly from said rods.

14. Apparatus as set forth in claim 13, and further including a post cathode located centrally with respect to said cathode assembly, to provide for a sputter coating step after or in combination with sputter cleaning.

15. Apparatus for sputtering material from surfaces of work-pieces in a gaseous environment, said apparatus comprising:
a housing for the gaseous environment;
a cathode assembly including
a hollow, generally cylindrical body made up of a plurality of flat mounting plates,
means for supporting a plurality of work-pieces on said mounting plates with surfaces from which material is to be sputtered facing inwardly and forming discontinuities in and departures from a perfectly cylindrical cathode surface, and
a pair of inwardly projecting end flanges affixed to said cylindrical body;
anode means biased positively with respect to said cathode assembly; and
magnetic field means for generating flux lines in close proximity to and substantially parallel with the surfaces of the work-pieces, said flux lines and the surfaces of said cathode assembly and work-pieces together defining a plasma trap region which encourages efficient sputtering from the work-pieces.

16. Apparatus as set forth in claim 15, and further including a sputtering shield locatable to intercept and collect the material sputtered from said cathode assembly.

17. Apparatus as set forth in claim 16, and further including a central post cathode connectable as a target cathode for sputter coating the work-pieces, said sputtering shield being removable for the coating operation.

18. A cathode sputtering method for processing work-pieces which require sputter cleaning, said method comprising the steps of:
supporting a plurality of work-pieces in a cathode assembly having a generally cylindrical shape and having means conducive to the formation of a plasma trap region adjacent to the work-piece surfaces, the surfaces of said work-pieces to be sputtered forming discontinuities in and departures from a perfectly cylindrical cathode surface;
applying a negative voltage to the cathode assembly with respect to an anode located just outside the plasma trap region;
exposing the cathode assembly and anode to a low pressure gaseous environment;
generating a magnetic field having flux lines closely adjacent and parallel to the surfaces of the work-pieces to be processed; and
sputtering material from the work-piece surface;
whereby the plasma trap region, defined by the magnetic field and surfaces of the cathode assembly, confines electrons to the region, maximizes the rate of ionization of the gaseous environment, and results in highly efficient sputter cleaning of the work-pieces.

19. A method as set forth in claim 18, wherein:
said supporting step includes securing a plurality of work-pieces to the exterior of a cylindrical cathode assembly having outwardly projecting end flanges.

20. A method as set forth in claim 18, wherein said supporting step includes securing a plurality of work-pieces to the interior of a cylindrical cathode assembly having inwardly projecting end flanges.

21. A method as set forth in claim 18, and further including the steps of:
collecting material sputtered from the work-pieces on a sputtering shield located to intercept the sputtered material;
subsequently removing the shield from its operative position by effecting relative movement between the shield and the cathode assembly;
as a result of said removing step, placing the cathode assembly in an operative relationship with a second cathode of coating material;
disconnecting the negative voltage previously applied to the cathode assembly;
then applying a negative voltage to the second cathode;
generating a magnetic field to establish a plasma trap adjacent the second cathode; and
coating the work-pieces with material sputtered from the second cathode;
whereby a sputter cleaning step can be immediately followed by a sputter coating step.

22. A method as set forth in claim 21, wherein:
said supporting step includes securing a plurality of work-pieces to the exterior of a cylindrical cathode assembly having outwardly projecting end flanges; and
said step of removing the shield is effected by moving the cathode assembly axially into operative relationship with a surrounding hollow second cathode, prior to said coating step.

23. A method as set forth in claim 21, wherein:
said supporting step includes securing a plurality of work-pieces to the interior of a cylindrical cathode assembly having inwardly projecting end flanges; and
said step of removing the shield is effected by axial movement thereof to expose the cathode assembly to material sputtered from the second cathode in the form of a central post cathode.

24. A method as set forth in claim 18, wherein:
said supporting step further includes supporting a plurality of work-pieces on each of a plurality of cylindrical post cathode sub-assemblies spaced uniformly about a central axis; and
said method further includes the steps of rotating each of the cathode sub-assemblies for more uniform sputtering, and collecting the sputtered material on shields located between the sub-assemblies.

25. A method as set forth in claim 24, and further including the steps of:
disconnecting the negative voltage previously applied to the cathode assembly;
applying a negative voltage to a post cathode located at the central axis;
generating a magnetic field to establish a plasma trap around the post cathode; and thereby
sputter coating the work-pieces with material from the post cathode.

26. A method as set forth in claim 18, and further including the steps of:
placing the cathode assembly in an operative relationship with a second cathode of coating material;
generating a magnetic field to establish a plasma trap region adjacent to the second cathode;

applying a negative voltage to the second cathode so that coating material is passed to the work-piece at the same time that work-piece material is being sputtered from the cathode assembly, thereby forming a mixed layer of work-piece material and coating material on surfaces of both the cathode assembly and the second cathode;

gradually decreasing to zero the negative voltage applied to the cathode assembly, thereby forming an interface of graded composition of work-piece material and coating material between the work-piece surface and the subsequently deposited pure coating material; and then coating the work-piece with material sputtered from the second cathode.

27. A method as set forth in claim 18, and further including the steps of:

placing the cathode assembly in an operative relationship with a second cathode of coating material;

generating a magnetic field to establish a plasma trap region adjacent to the second cathode;

applying a negative voltage to the second cathode assembly so that coating material is passed to the work-pieces at the same time that work-piece material is being sputtered from the cathode assembly, thereby forming a mixed layer of work-piece material and coating material on surfaces of both the cathode assembly and the second cathode; and reducing the potential applied to the cathode assembly to a value at which there is a net flux of material from the second cathode to the cathode assembly, and at which the resultant coating formed on the work-pieces has desired structural properties.

* * * * *